United States Patent [19]
Berar

[11] Patent Number: 6,115,645
[45] Date of Patent: Sep. 5, 2000

[54] SEMICONDUCTOR TESTER WITH REMOTE DEBUGGING FOR HANDLER

[75] Inventor: Andrei Berar, Campbell, Calif.

[73] Assignee: Credence Systems Corporation, Fremont, Calif.

[21] Appl. No.: 08/914,581

[22] Filed: Aug. 18, 1997

[51] Int. Cl.[7] .................................................. G11C 8/00
[52] U.S. Cl. ........................................... 700/121; 700/108
[58] Field of Search ............................... 700/121, 95, 96, 700/108, 109, 107, 118, 119; 414/937–940; 318/570

[56] References Cited

U.S. PATENT DOCUMENTS

| | | | |
|---|---|---|---|
| 5,464,313 | 11/1995 | Ohsawa | 414/937 |
| 5,500,081 | 3/1996 | Bergman | 438/706 |
| 5,664,337 | 9/1997 | Davis et al. | 414/416 |
| 5,769,269 | 6/1998 | Peters | 360/92 |
| 5,943,437 | 8/1999 | Sumie et al. | 382/149 |
| 6,008,061 | 12/1999 | Kasai | 438/18 |
| 6,009,039 | 12/1999 | Takamae et al. | 365/233 |

*Primary Examiner*—William Grant
*Assistant Examiner*—Kidest Bahta
*Attorney, Agent, or Firm*—John Smith-Hill; Smith-Hill and Bedell

[57] ABSTRACT

A semiconductor tester at a first station includes a device handler operating under control of a first computer located at the first station. The handler is provided with a video camera having an output connected to a port of the first computer. A second computer, which includes a display monitor, is located at a second station, which is remote from the first station, and the first and second computers are connected in a computer network. The video camera is employed to acquire an image of the handler and the video camera provides the first computer with video data representative of this image. The video data is transmitted over the computer network to the second computer and is provided to the display monitor, whereby the image acquired by the video camera can be viewed on the display monitor. Information regarding operation of the device handler is transmitted from the second station to the first station.

7 Claims, 1 Drawing Sheet

SEMICONDUCTOR TESTER WITH REMOTE DEBUGGING FOR HANDLER

BACKGROUND OF THE INVENTION

A conventional semiconductor tester for testing semiconductor integrated circuit devices in packaged form includes a device handler for placing the packaged devices at a test location for interfacing with a test head. The handler is a complex mechanical structure which must perform numerous distinct tasks. Specifically, the handler must pick up each device from a receiving location which is defined with a relatively low degree of precision, position the device at the test location with a high degree of precision and subsequently transport the device from the test location and deposit it at a discharge location. The handler must perform these tasks without colliding with other elements of the tester and without damaging the integrated circuit devices. In order to provide rapid throughput of devices, the handler must perform its tasks at a relatively high rate.

The nature of the handler and the demands that are placed on the handler are such that there is a significant possibility of malfunction, such as a jamming of moving parts. In order to minimize downtime, it is necessary to be able to correct the malfunction quickly. However, the person in charge of operating the tester might not have appropriate skills for diagnosing a malfunction in the handler and making the proper adjustment or repair. The operator must therefore call on assistance from a maintenance engineer having suitable skills.

When the maintenance engineer is called in to adjust or repair a handler, she will normally bring tools and parts based on the nature of the malfunction, as described to her by the operator. If the operator did not properly interpret the symptoms of the malfunction, or did not properly describe the symptoms to the engineer, there is a possibility that the engineer will not bring the appropriate tools and parts and will need to make a second trip, adding to downtime before the handler is functional. Further, the handler is normally located in a clean room whereas the maintenance engineer's work location is normally outside the clean room and so the maintenance engineer must don clean room clothing on each trip to the handler, adding to downtime and inconvenience. There is also a possibility that a maintenance engineer having suitable skills will not even be in the same facility as the handler that requires adjustment or repair, so that travel time might further delay adjustment or repair.

In the event of an electronic malfunction in a computer used to control operation of a semiconductor tester, it is conventional to connect the malfunctioning computer to the public telephone network using a modem and for an engineer at a remote supervisory computer, also connected to the public telephone network, to diagnose the fault in the malfunctioning computer by using the supervisory computer to test the malfunctioning computer and correct the fault by transmitting suitable commands and messages to the malfunctioning computer via its modem. This technique is not suitable for use in diagnosing and correcting mechanical malfunctions in a device handler associated with a semiconductor tester.

SUMMARY OF THE INVENTION

According to a first aspect of the present invention there is provided a method of monitoring a semiconductor tester operating at a first station under control of a first computer located at the first station, the method comprising providing a video camera located at the first station, the video camera having an output connected to a port of the first computer, providing a second computer located at a second station, which is remote from the first station, wherein the first and second computers are connected in a computer network and the second computer includes a display monitor, employing the video camera to acquire an image of the tester, whereby the video camera provides the first computer with video data representative of said image, transmitting said video data over the computer network to the second computer, providing said video data to the display monitor, whereby the image acquired by the video camera can be viewed on the display monitor, and transmitting information from the second station to the first station regarding operation of the semiconductor tester.

According to a second aspect of the present invention there is provided a semiconductor test facility, for testing integrated circuit devices, comprising a device handler for receiving integrated circuit devices at an input station, delivering the devices to a test location, removing the devices from the test location and transporting the devices to an output station for further processing, and a video camera selectively positionable to acquire an image of the handler, and wherein operation of the handler is controlled by a computer having a handler CPU, the handler CPU is connected over a computer network to a supervisory computer at a remote location, the supervisory computer includes a display monitor, and the video camera is connected to the handler CPU for supplying the acquired image over the computer network to the supervisory computer for viewing at the remote location on the display monitor.

According to a third aspect of the present invention there is provided a semiconductor test facility comprising a plurality of semiconductor testers in a clean room, each tester including an integrated circuit device handler which is controlled by a dedicated computer having a handler CPU and a video camera connected to the handler CPU and positionable to capture an image of a selected region of the handler, a supervisory computer located outside the clean room and having a supervisory CPU and a display monitor, and a network connecting each of the handler CPUs to the supervisory CPU, whereby the display monitor of the supervisory computer can display an image of any of the handlers, as captured by the respective video cameras.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
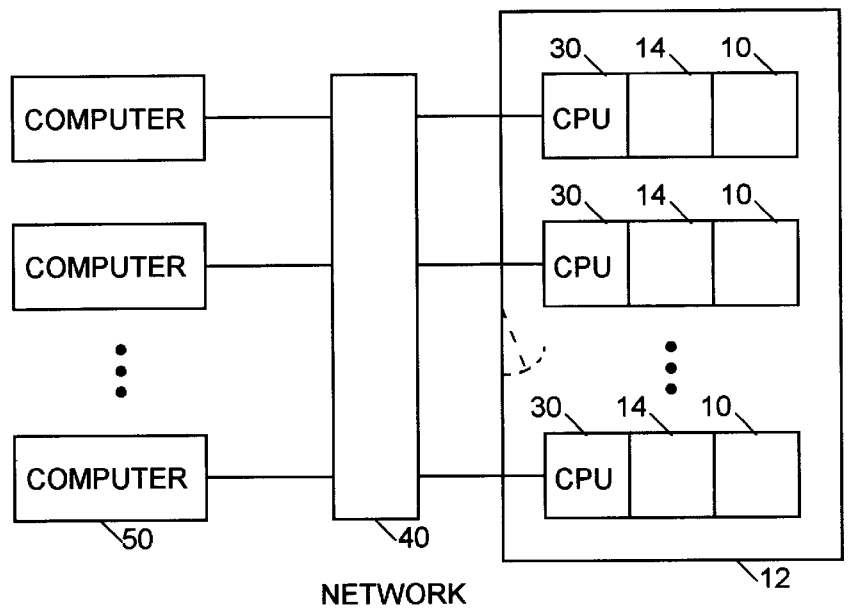
FIG. 1 is a schematic diagram illustrating multiple semiconductor testers and associated equipment.
Figure 2:
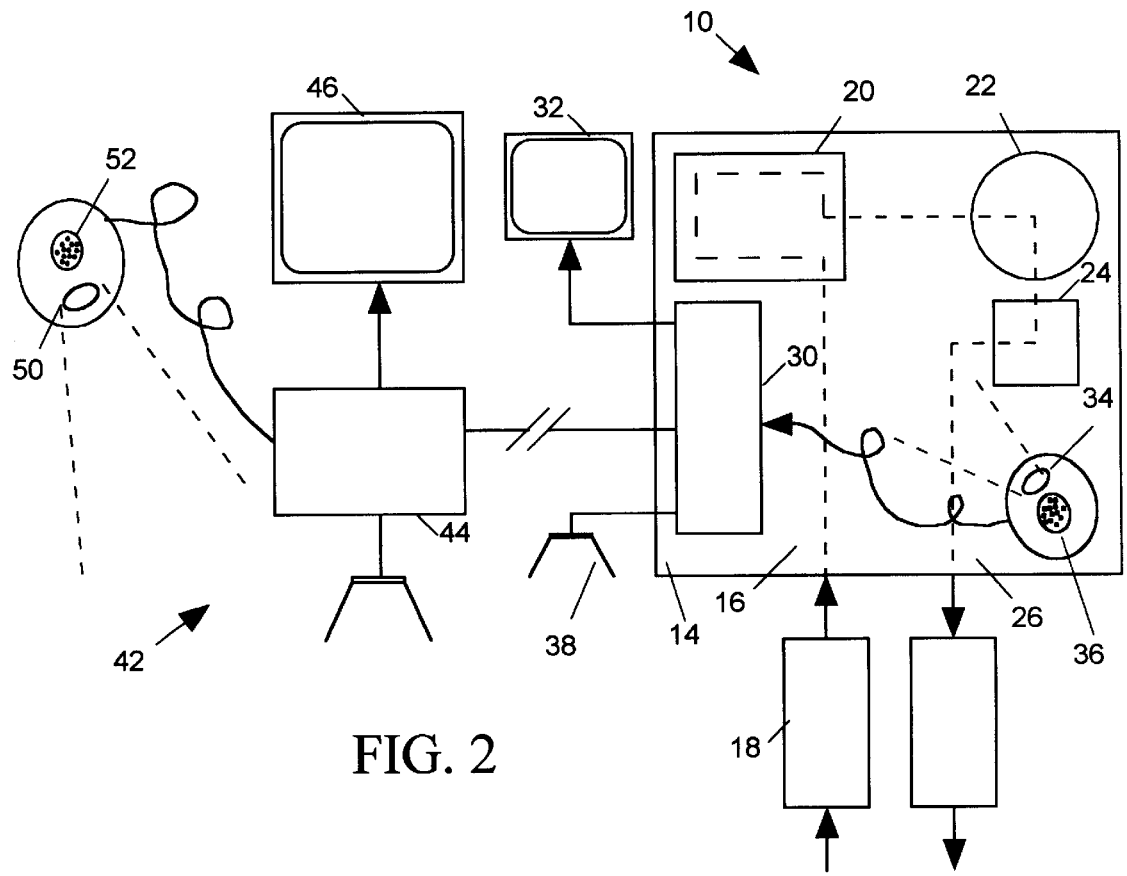
FIG. 2 is a schematic diagram showing parts of FIG. 1 in greater detail.

FIG. 1 illustrates several semiconductor testers 10 in a clean room 12 at a semiconductor fabrication and test facility. Referring to FIG. 2, each semiconductor tester 10 includes a handler 14 having an input station 16 at which it receives trays 18, each of which contains several, typically at least one hundred, packaged integrated circuit devices to be tested. The handler removes the devices from the tray at the input station and transports the devices through a hot chamber 20, in which the devices are heated to the temperature at which they are to be tested. The handler then delivers the devices to a test location at which the devices are interfaced with a test head 22 for testing. After testing, the handler transports the devices to an inspection unit 24 where the devices are inspected for damage during testing, such as bent leads, and to an output station 26.

Concurrently with transporting the devices from the input station 16 to the output station 18 by way of the hot chamber 20, the test location and the inspection unit 24, the handler transports the empty tray directly from the input station 16 to the output station 26. At the output station the devices are returned to the tray. The tray containing the tested devices is removed from the tester for further processing.

Operation of each tester 10, including its handler 14, is controlled by a dedicated controlling computer which coordinates the various operations of the handler. The controlling computer includes a central processing unit 30 having a video output connected to a display monitor 32 for displaying images to the tester's operator. The CPU 30 has a serial port (not shown) and a video camera 34 is connected to the CPU 30 by way of the serial port. The video camera 34 is positioned to acquire an image of a portion of the handler 14. The video camera is moveable relative to the handler so that the image can be selected by the operator. The video camera is mounted in a housing which also contains a microphone 36 for acquiring an acoustic signal. The controlling computer includes a sound card (not shown) having an output connected to a loudspeaker 38.

The CPU 30 is connected to a network adapter (not shown) by which the controlling computer is able to communicate over a network 40 (FIG. 1) with other computers. The network may be a local area network, in which all the computers are connected by dedicated cables, or it may include the public telephone network, the Internet, or other propagation media. The other computers connected to the network include a supervisory computer 42 outside the clean room 12 and may also include the computers that control operation of the other testers in the clean room 12 and in other clean rooms, possibly in the same facility and possibly in other facilities. The supervisory computer 42 may be physically located in the same facility as the clean room 12 or it may be located outside that facility, for example at the premises of the tester manufacturer or at a service center.

The supervisory computer 42 includes a CPU 44 having a video output connected to a display monitor 46 for displaying images to a maintenance engineer. The CPU 44 has a serial port by which a video camera 50 is connected to the CPU 44. The video camera 50 is mounted in a housing which also contains a microphone 52 for acquiring an acoustic signal. The supervisory computer includes a sound card having an output connected to a loudspeaker.

In the event of a malfunction in the handler 14, the operator calls attention to the fact of the malfunction by using the controlling computer to transmit a message over the network 34 to the supervisory computer 42. A window opens on the display monitor of the supervisory computer, alerting the maintenance engineer. The operator and the maintenance engineer are able to discuss the malfunction over the audio communication channel provided between the controlling computer and the supervisory computer by the microphones in the respective video camera housings and the loudspeakers of the respective computers. If the operator is able to provide sufficient information to permit the maintenance engineer to diagnose the malfunction and instruct on adjustment and repair, there is no need for further communication at this time between the operator and the maintenance engineer. However, if the maintenance engineer is in doubt as to the proper diagnosis, she can instruct the operator to position the video camera 34 to acquire an image of the portion of the handler 14 that appears to be malfunctioning. The engineer can access the file containing the image acquired by the video camera 34 and can view the image on the display monitor 46. The maintenance engineer might be able to diagnose the malfunction based on the image, but if she cannot diagnose the malfunction based on this image she can instruct the operator to move the camera 34 to acquire a different image which will possibly be helpful in diagnosing the malfunction. If the maintenance engineer is able to diagnose the malfunction based on the images provided by the camera 34, and she determines that the adjustment or repair is within the skill of the operator, she can instruct the operator regarding the adjustment or repair to be made. The maintenance engineer can use the camera 50 to acquire an image that will be helpful to the operator in making the adjustment or repair and the operator can view this image on the display monitor 32. Alternatively, the maintenance engineer can instruct the operator to access a stored image file that will be helpful. In either case, the image might be, for example, a drawing illustrating the proper setup of components or a view of the malfunctioning part when properly adjusted. If the adjustment or repair should require tools or parts that are not in the clean room, the maintenance engineer can instruct the operator regarding the tools or parts that will be needed to make the adjustment or repair, so that the operator can gather all necessary tools and parts in a single trip from the clean room.

It will therefore be seen that, in a suitable case, the maintenance engineer can diagnose the problem and instruct the operator regarding the necessary steps for adjustment without entering the clean room and without even being in the same facility as the malfunctioning tester, thereby minimizing downtime. Further, if the adjustment or repair should be beyond the skill of the operator, the maintenance engineer can make a determination regarding the tools and parts that are required before entering the clean room, thereby avoiding the need to make two trips. This allows the maintenance engineer to delegate the more routine maintenance tasks to the operator and devote her efforts to tasks that require a higher level of skill, thereby using her time more efficiently. The maintenance engineer is then able to service the testers for which she is responsible more efficiently than if she had to visit the tester site and enter the clean room for every adjustment or repair, and accordingly the maintenance cost per tester is reduced.

The video camera serves an analagous function to the modem used previously to diagnose an electrical malfunction in the computer used to control operation of a semiconductor tester, in that it allows a suitably skilled engineer to diagnose the fault from a remote location.

Since each tester is equipped with its own video camera, the video camera will always be close to the handler and available to view the handler. This ensures that there is no problem with availability of a camera to view the handler and that limitations inherent in using one camera to view multiple testers, such as the camera being committed to use with another tester. Further, workplace hazards arising from use of a single camera to view multiple testers, such as loose cables running over the floor of the clean room, are avoided.

It will be appreciated that the invention is not restricted to the particular embodiment that has been described, and that variations may be made therein without departing from the scope of the invention as defined in the appended claims and equivalents thereof.

What is claimed is:

1. A method of monitoring a semiconductor integrated circuit tester operating at a first station under control of a first computer located at the first station, the method comprising:

providing a video camera located at the first station, the video camera having an output connected to a port of the first computer, providing a second computer located at a second station, which is remote from the first station, wherein the first and second computers are connected in a computer network and the second computer includes a display monitor, employing the video camera to acquire an image of the tester, whereby the video camera provides the first computer with video data representative of said image, transmitting said video data over the computer network to the second computer, providing said video data to the display monitor, employing the display monitor to display the image represented by said video data, whereby the image acquired by the video camera can be viewed on the display monitor, and transmitting information from the second station to the first station regarding operation of the semiconductor tester.

2. A semiconductor integrated circuit test facility, for testing integrated circuit devices, comprising:

a device handler for receiving integrated circuit devices at an input station, delivering the devices to a test location, removing the devices from the test location and transporting the devices to an output station for further processing, and a video camera selectively positionable to acquire an image of the handler, and wherein operation of the handler is controlled by a computer having a handler CPU, the handler CPU is connected over a computer network to a supervisory computer at a remote location, the supervisory computer includes a display monitor, the video camera is connected to the handler CPU and supplies the acquired image over the computer network to the supervisory computer, and the display monitor displays the acquired image for viewing at the remote location.

3. A semiconductor test facility according to claim 2, wherein the device handler is located in a clean room and the supervisory computer is located outside the clean room.

4. A semiconductor test facility according to claim 2, wherein the supervisory computer includes a CPU and the facility further comprises a second video camera having an output connected to the CPU of the supervisory computer and the handler computer includes a display monitor.

5. A semiconductor test facility according to claim 2, comprising a microphone integrated with the video camera for acquiring an acoustic signal generated in the vicinity of the handler and wherein the supervisory computer includes a transducer means for receiving audio data from the handler CPU and reproducing the acoustic signal at the remote location.

6. A semiconductor test facility according to claim 5, wherein the supervisory computer includes a CPU and the facility further comprises a second video camera having an output connected to the CPU of the supervisory computer, a second microphone is integrated with the second video camera for acquiring an acoustic signal generated in the vicinity of the supervisory computer, and the handler computer includes a transducer means for receiving audio data from the supervisory computer over the network and reproducing the acoustic signal in the vicinity of the handler.

7. A semiconductor integrated circuit test facility comprising:

a plurality of semiconductor integrated circuit testers in a clean room, each tester including an integrated circuit device handler which is controlled by a dedicated computer having a handler CPU and a video camera connected to the handler CPU and positionable to capture an image of a selected region of the handler, a supervisory computer located outside the clean room and having a supervisory CPU and a display monitor, and a network connecting each of the handler CPUs to the supervisory CPU, whereby the display monitor of the supervisory computer displays an image of a selected handler, as captured by the video camera of the tester that includes the selected handler.

* * * * *

UNITED STATES PATENT AND TRADEMARK OFFICE
CERTIFICATE OF CORRECTION

PATENT NO. : 6,115,645
DATED : September 5, 2000
INVENTOR(S) : Andrei Berar

It is certified that error appears in the above-identified patent and that said Letters Patent is hereby corrected as shown below:

```
Column 5, line 21 (Claim 1, line 24), after
```
"semiconductor" --integrated circuit-- should be inserted.

Signed and Sealed this

Seventeenth Day of April, 2001

*Attest:*

NICHOLAS P. GODICI

*Attesting Officer*   Acting Director of the United States Patent and Trademark Office